United States Patent
Bhat et al.

(10) Patent No.: US 11,218,113 B1
(45) Date of Patent: Jan. 4, 2022

(54) DUAL-CORE DUAL-RESONANCE COMPACT INDUCTOR-CAPACITOR VOLTAGE CONTROLLED OSCILLATOR

(71) Applicant: Cisco Technology, Inc., San Jose, CA (US)

(72) Inventors: Abhishek Bhat, Kumbla (IN); Romesh Kumar Nandwana, Breinigsville, PA (US); Kadaba Lakshmikumar, Basking Ridge, NJ (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 17/031,462

(22) Filed: Sep. 24, 2020

(51) Int. Cl.
H03B 5/12 (2006.01)

(52) U.S. Cl.
CPC ......... H03B 5/1212 (2013.01); H03B 5/1228 (2013.01); *H03B 2200/004* (2013.01); *H03B 2200/0082* (2013.01)

(58) Field of Classification Search
CPC ............... H03B 5/1212; H03B 5/1228; H03B 2200/004; H03B 2200/0082
USPC ................................. 331/167, 117 FE, 177 V
See application file for complete search history.

(56) References Cited

U.S. PATENT DOCUMENTS

| | | | |
|---|---|---|---|
| 8,344,811 B2 * | 1/2013 | Bao ...................... | H03B 5/1228 331/2 |
| 9,742,353 B2 * | 8/2017 | Murphy ............... | H03B 5/1265 |

OTHER PUBLICATIONS

E. Hegazi, H. Sjoland and A. A. Abidi, "A filtering technique to lower LC oscillator phase noise," IEEE Journal of Solid-State Circuits, vol. 36, No. 12, pp. 1921-1930, Dec. 2001. Abstract Only.
D. Murphy, H. Darabi and H. Wu, "A VCO with implicit common-mode resonance," 2015 IEEE International Solid-State Circuits Conference, San Francisco, CA, 2015, pp. 1-3. Abstract Only.
Y. Hu, T. Siriburanon and R. B. Staszewski, "A Low-Flicker-Noise 30-GHz Class-F23 Oscillator in 28-nm CMOS Using Implicit Resonance and Explicit Common-Mode Return Path," IEEE Journal of Solid-State Circuits, vol. 53, No. 7, pp. 1977-1987, Jul. 2018. Abstract Only.
C.-C. Lim, et.al, "An inverse-class-F CMOS VCO with intrinsic-high-Q 1st- and 2nd-harmonic resonances for 1/f2-to-1/f3 phase-noise suppression achieving 196.2dBc/Hz FOM," 2018 IEEE International Solid-State Circuits Conference—(ISSCC), Feb. 2018, pp. 374-376.

(Continued)

*Primary Examiner* — Arnold M Kinkead
(74) *Attorney, Agent, or Firm* — Patterson + Sheridan, LLP

(57) ABSTRACT

A voltage controlled oscillator (VCO) is described. The VCO includes a plurality of nodes coupled with a plurality of transistors, and a first inductor-capacitor (LC) tank coupled with a second LC tank. The first LC tank and the second LC tank include a shared inductor structure coupled to the plurality of nodes. The first LC tank and the second LC tank each include a capacitor. The capacitors are each coupled on a first side to a node of the plurality of nodes and on a second side to a respective capacitor in the other LC tank. The first LC tank and the second LC tank are configured to resonate at a fundamental frequency for differential-mode signals, and the first LC tank and the second LC tank are configured to resonate at twice the fundamental frequency for common-mode signals.

15 Claims, 10 Drawing Sheets

(56) References Cited

OTHER PUBLICATIONS

H. Guo, et.al, "26.2 A 0.08mm2 25.5-to-29.9GHz Multi-Resonant-RLCM-Tank VCO Using a Single-Turn Multi-Tap Inductor and CM-Only Capacitors Achieving 191.6dBc/Hz FoMand 130kHz 1/f3 PN Corner," 2019 IEEE International Solid-State Circuits Conference—(ISSCC), Feb. 2019. Abstract Only.
Amir Masnadi, et.al, "A Compact Dual-Core 26.1-to-29.9GHz Coupled-CMOS LC-VCO with Implicit Common-Mode Resonance and FoMof-191 dBc/Hz at 10MHz" CICC2020 (to be published in IEEExplore).

\* cited by examiner

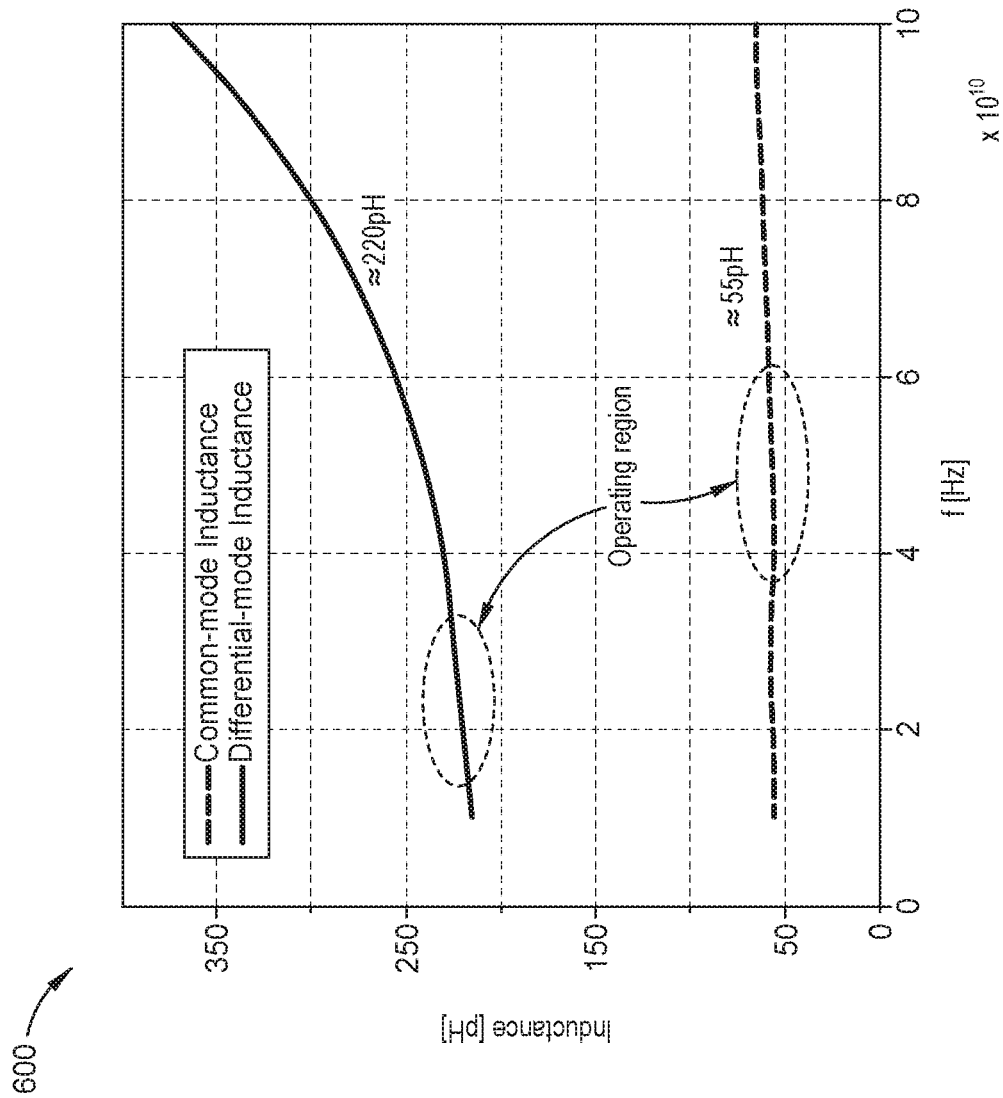

DUAL-CORE DUAL-RESONANCE COMPACT INDUCTOR-CAPACITOR VOLTAGE CONTROLLED OSCILLATOR

TECHNICAL FIELD

Embodiments presented in this disclosure generally relate to electronic communications. More specifically, embodiments disclosed herein relate to a voltage controlled oscillator for wireline and wireless communication systems.

BACKGROUND

Increasing data rate requirements, in both wireline and wireless communication systems, pose design challenges for clocking circuits. For example, wireless and wireline communication systems can include multiple clock generators (e.g., on a single chip). Clock generators for these systems are designed to reduce power consumption, while maintaining accuracy.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate typical embodiments and are therefore not to be considered limiting; other equally effective embodiments are contemplated.

FIG. 6A is a graph illustrating a simulation of common-mode and differential-mode inductance in an improved LC VCO architecture, according to an embodiment.

To facilitate understanding, identical reference numerals have been used, where possible, to designate identical elements that are common to the figures. It is contemplated that elements disclosed in one embodiment may be beneficially used in other embodiments without specific recitation.

DESCRIPTION OF EXAMPLE EMBODIMENTS

Overview

Figure 1:
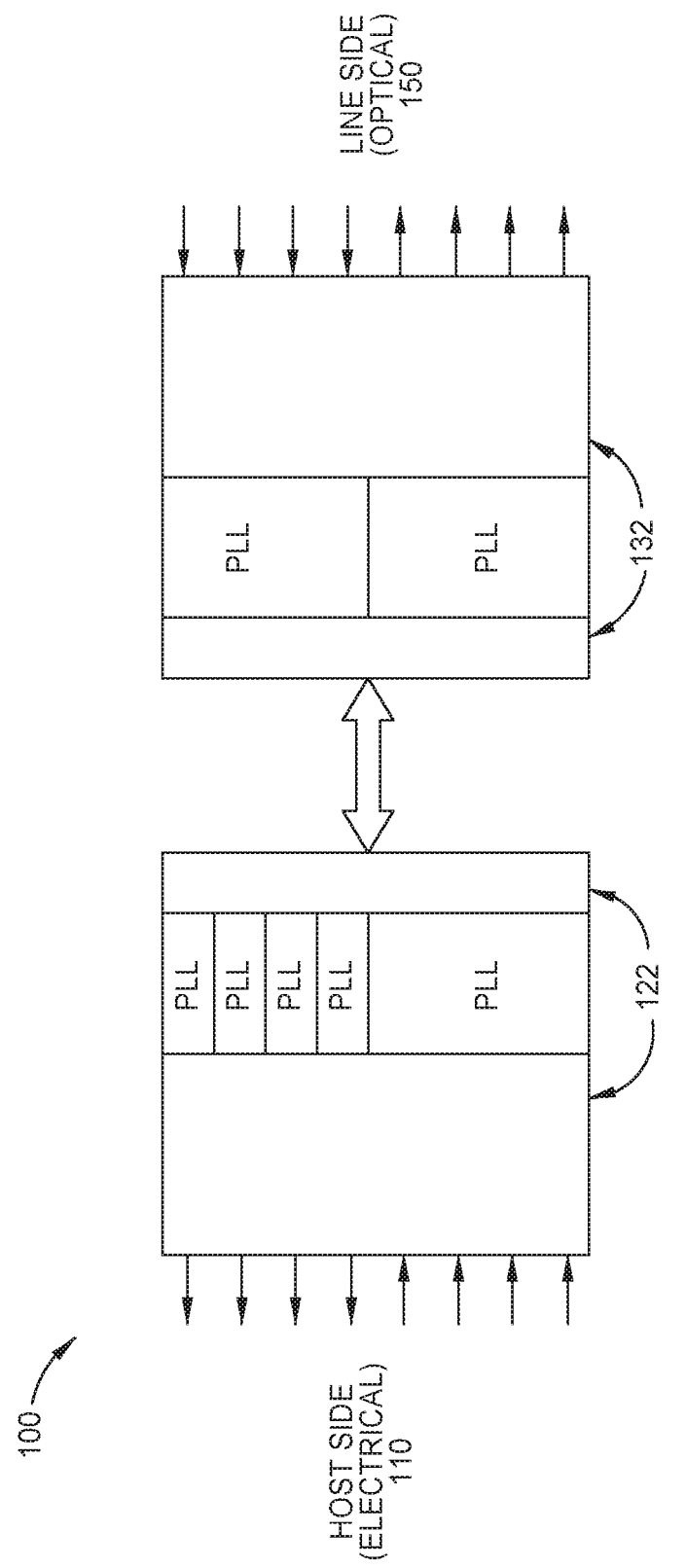
FIG. 1 illustrates clocking complexity in an example multi-lane transceiver, according to an embodiment.

Embodiments include a VCO. The VCO includes a plurality of nodes coupled with a plurality of transistors. The VCO further includes a first LC tank coupled with a second LC tank. The first LC tank and the second LC tank include a shared inductor structure coupled to the plurality of nodes. The first LC tank and the second LC tank each include a capacitor, and the capacitors are each coupled on a first side to a node of the plurality of nodes and on a second side to the respective capacitor in the other LC tank. The first LC tank and the second LC tank are configured to resonate at a fundamental frequency for differential-mode signals, and the first LC tank and the second LC tank are configured to resonate at twice the fundamental frequency for common-mode signals.

Embodiments further include another VCO. The VCO includes a plurality of nodes coupled with a plurality of transistors. The VCO further includes a first LC tank directly coupled with a second LC tank. The first LC tank and the second LC tank include a shared inductor structure coupled to the plurality of nodes. The first LC tank and the second LC tank are configured to resonate at a fundamental frequency for differential-mode signals, and the first LC tank and the second LC tank are configured to resonate at twice the fundamental frequency for common-mode signals.

Embodiments further include another VCO. The VCO includes a first LC tank including a first pair of inductors, and a second LC tank including a second pair of inductors. The first pair of inductors are each directly coupled to at least one of the second pair of inductors through a third inductor. The first LC tank and the second LC tank are configured to resonate at a fundamental frequency for differential-mode signals, and the first LC tank and the second LC tank are configured to resonate at twice the fundamental frequency for common-mode signals.

EXAMPLE EMBODIMENTS

In wireline systems, multi-lane, single chip solutions can be used to increase overall data throughput. Multiple clock generators can be used in a single chip to accommodate these multi-lane solutions. Very low jitter clocks are used to reduce error, due to small timing margins. Further, the power consumption of each clock generator is optimized to reduce the overall power usage. Similarly, in wireless systems, multiple clock generators are used in multiple input-multiple output (MIMO) systems. The power consumption of each clock generator is minimized. Further, integrated phase error is kept low to reduce the error vector magnitude, and phase noise is minimized to improve adjacent channel suppression.

Phase locked loops (PLL) are commonly used, in both wireline and wireless systems, to generate accurate clocks. PLL power can be minimized to improve the efficiency of the chip. Voltage controlled oscillators (VCO) consume a significant amount of power in PLLs. Therefore, it is desirable for a VCO to provide a low phase noise clock, with minimal power consumption. Reducing phase noise, however, typically consumes more power. Inductor-capacitor VCOs (LC VCO) can be used to minimize phase noise, but conventional LC VCOs consume more silicon area, due to the inductor(s) (L) and capacitor(s) (C). Reducing phase noise and jitter for LC VCOs with low power, and area, is a significant challenge, especially for multi-lane transceiver integrated circuits (ICs).

An improved VCO architecture can be used to solve at least some of these issues. A dual-core topology can be used, in which two LC-tanks (e.g., identical LC-tanks) are strongly (e.g., directly) coupled to reduce phase noise. A dual resonance topology can also be used, in which a single set of capacitor banks is used to resonate the LC-tank(s) at a fundamental frequency for differential-mode signals and at, for example, double the fundamental frequency for common-mode signals.

The dual-core topology can be implemented using a CMOS structure, reusing current and avoiding extra power overhead. This is an improvement over commonly used dual-core VCOs, which consume double the power. Further, strong coupling between the two LC tanks ensures oscillation at a single fundamental frequency without any ambiguity, and dual resonance greatly suppresses the flicker noise up-conversion to phase noise.

One or more embodiments described herein relate to an improved VCO architecture that combines a dual-core and dual resonance architecture, using an inductor structure to achieve very low phase noise. In an embodiment, the VCO consumes less area than prior dual LC tank structures, because it uses only one inductor structure. Further, in an embodiment, the proposed dual-resonance topology does not use any single ended capacitor banks to ground, thereby avoiding any quality factor degradation at high frequencies. In an embodiment the proposed VCO does not require independent tuning of first and second harmonic resonance, making it robust, and dual resonance significantly reduces phase noise. For example, dual resonance can reduce phase noise by 9-10 dB in the flicker noise dominated region (e.g., a 100 k-1 MHz offset), thereby reducing the total jitter by 65% when compared to a conventional CMOS LC VCO, while also reducing power consumption by a factor of ten as compared to a conventional CMOS LC VCO For example, to achieve the same phase noise as one or more techniques described herein, a conventional VCO will consume approximately 10 times more power.

FIG. 1 illustrates clocking complexity in an example multi-lane transceiver 100, according to an embodiment. Modern transceivers often include a large number of lanes, and a large number of PLLs. In an embodiment, each PLL includes a VCO. This means that the VCO should be compact, while still limiting jitter and noise.

For example, the transceiver 100 (e.g., an opto-electronic multi-gigabit transceiver) transmits data between an electrical host side 110 and an optical line side 150. The host side of the transceiver 100 includes components 122 (e.g., ports, filters, clock data recovery components, serializers, modulation components, etc.). The host side further includes multiple PLLs (e.g., five as illustrated), each of which includes a VCO. The line side of the transceiver 100 includes components 132 (e.g., modulators, amplifiers, serializers, clock data recovery components, etc.) and additional PLLs (e.g., two as illustrated), each of which includes a VCO. Thus, the example transceiver 100 includes seven PLLs and seven VCOs. In an embodiment, this multiple PLL based architecture reduces frequency error transfer between host and line sides, to provide independent frequency control. It is desirable for the VCOs to be compact and power efficient while limiting jitter and noise. In an embodiment, a VCO can be used in a PLL or in any other suitable application (e.g., a function generator, a frequency synthesizer, etc.).

Figure 2B:
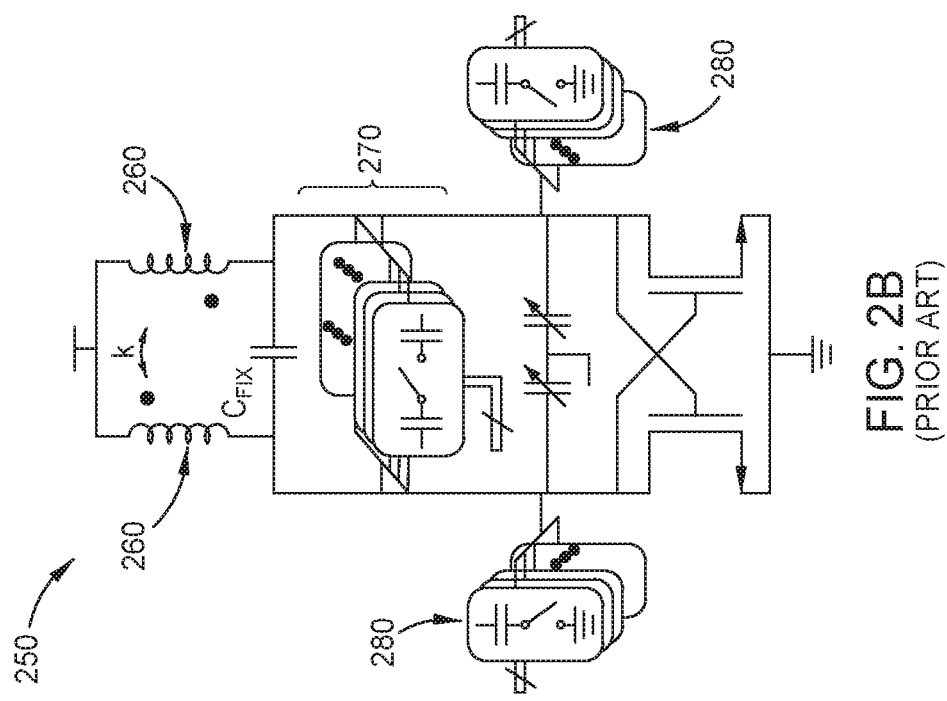
FIG. 2B illustrates an example existing LC VCO architecture with implicit common mode resonance, according to an embodiment.
Figure 2A:
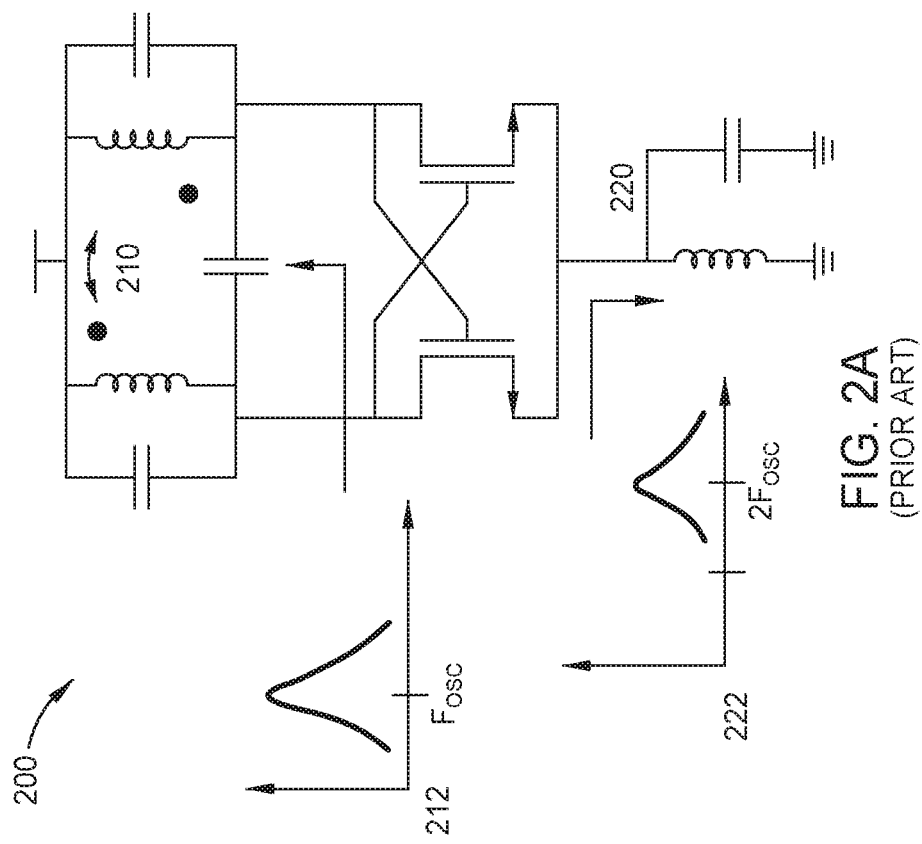
FIG. 2A illustrates an example existing inductor-capacitor (LC) voltage controlled oscillator (VCO) architecture implementing a tail-filtering technique, according to an embodiment.

FIG. 2A illustrates an example existing LC VCO architecture implementing a tail-filtering technique, according to an embodiment. Here, a VCO 200 includes two LC tanks: a differential mode tank 210 and a common mode tank 220. The common mode tank 220 oscillates at twice the frequency of the differential mode tank 210. This is illustrated in graphs 212 and 222. Graph 222 corresponds with the common mode tank while graph 212 corresponds with the differential mode tank. The oscillation frequency (Fosc) for the common mode tank, illustrated in the graph 222, is double the oscillation frequency for the differential mode tank illustrated the graph 212.

This design provides several advantages. It includes high impedance at the common mode tank 220, which reduces flicker noise and improves reliability of a clock if the VCO is used in a PLL. But using two separate LC tanks 210 and 220 consumes significant chip area. Further, the two tanks must be independently tuned. For example, the capacitor in the common mode tank 220 must be tuned to ensure that the common mode tank 220 resonates at twice the frequency of the differential mode tank 210. This can make the VCO 200 less reliable.

FIG. 2B illustrates an example existing LC VCO architecture with implicit common mode resonance, according to an embodiment. A VCO 250 includes a single core inductance 260 and two banks of capacitors: differential mode capacitors 270 and common mode capacitors 280. The VCO 250 has several advantages. For example, it saves chip area, as compared to designs with two inductance areas (e.g., the VCO 200 illustrated in FIG. 2A). The VCO 250 also has low phase noise, similar to the VCO 200 illustrated in FIG. 2A.

The VCO 250, however, includes two sets of capacitor banks, 270 and 280. Any mismatch between the capacitor banks 270 and 280 can degrade performance. The capacitor banks must also be independently tuned to ensure that the common mode resonance (e.g., using the common mode capacitors 280) is twice the frequency of the differential mode resonance (e.g., using the differential mode capacitors 270). Further, the VCO 250 relies on single ended capacitor banks, which can have poor performance in very high frequency implementations. The common-mode current return paths must be thoroughly simulated at high frequencies, which can be burdensome and expensive.

Figure 2C:
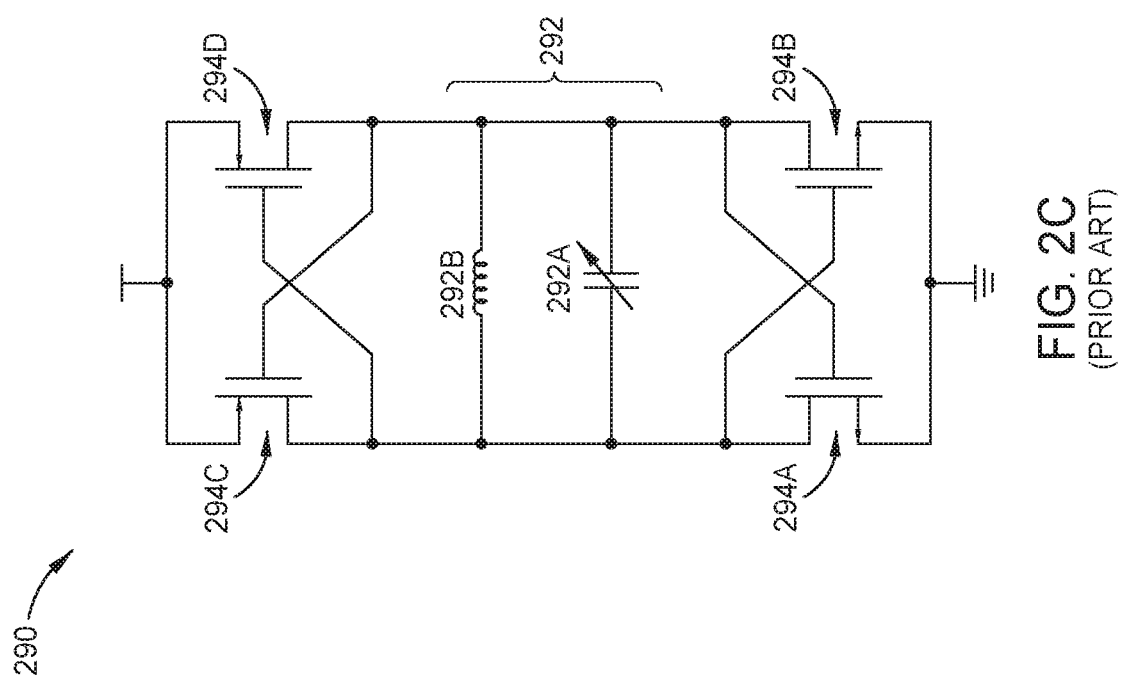
FIG. 2C illustrates an example existing CMOS LC VCO architecture, according to an embodiment.

FIG. 2C illustrates an example existing CMOS LC VCO architecture 290, according to an embodiment. The VCO architecture 290 includes a single differential mode LC tank 292. In an embodiment, the LC tank 292 is tuned to the oscillator frequency. The VCO architecture 290 includes a variable capacitor 292A and an inductor 292B. In an embodiment, the variable capacitor 292A is varied using a voltage or digital logic to tune the frequency. The LC VCO architecture 290 is relatively simple to implement, and is commonly used in low power applications. But, in an embodiment, the LC VCO architecture does not suppress flicker noise from transistors 294A-D, leading to high phase noise and jitter.

Figure 3:
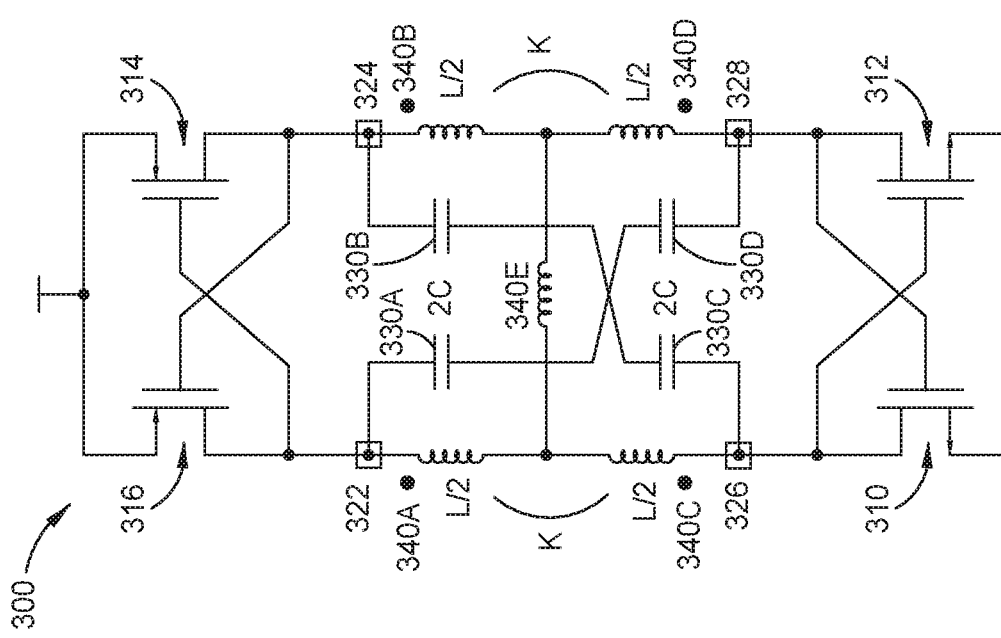
FIG. 3 is a schematic illustrating an improved LC VCO architecture, according to an embodiment.

FIG. 3 is a schematic illustrating an improved LC VCO architecture 300, according to an embodiment. The LC VCO architecture 300 includes four transistors 310, 312, 314, and 316. In an embodiment, the transistors 310 and 312 are NMOS transistors while the transistors 314 and 316 are PMOS transistors. This is merely one example, and any suitable combination of transistors can be used. Further, MOSFET transistors are merely one example and any suitable transistor technology can be used. For example, bipolar junction transistors (BJTs) could be used (e.g., in a Bipolar CMOS (BiCMOS) architecture).

The transistors 310, 312, 314, and 316 define four nodes 322, 324, 326, and 328. For example, the node 326 is connected to the drain of the transistor 310 and the gate of the transistor 312. The node 328 is connected to the drain of the transistor 312 and the gate of the transistor 310. The node 322 is connected to the drain of the transistor 316 and the gate of the transistor 314. The node 324 is connected to the drain of the transistor 314 and the gate of the transistor 316.

The LC VCO architecture 300 further includes capacitors 330A-D and inductors 340A-E. In an embodiment, the capacitors 330A-D and the inductors 340A-D form two LC tanks, forming a dual-core VCO. For example, the inductors 340A, 340E and 340D, and the capacitors 330A and 330D can form one LC tank, while the inductors 340B, 340E and 340C, and capacitors 330B and 330C form another LC tank. The inductance 340E is shared between the two LC tanks. As illustrated, in an embodiment these two LC tanks are strongly coupled (e.g., they are directly coupled with coupling coefficient k). Further, in an embodiment, the capacitors 330A-D are not fixed capacitors, and can be controlled (e.g., using logic or voltage). This facilitates the LC VCO architecture 300 acting as a VCO, as opposed to a fixed frequency oscillator.

Figure 4:
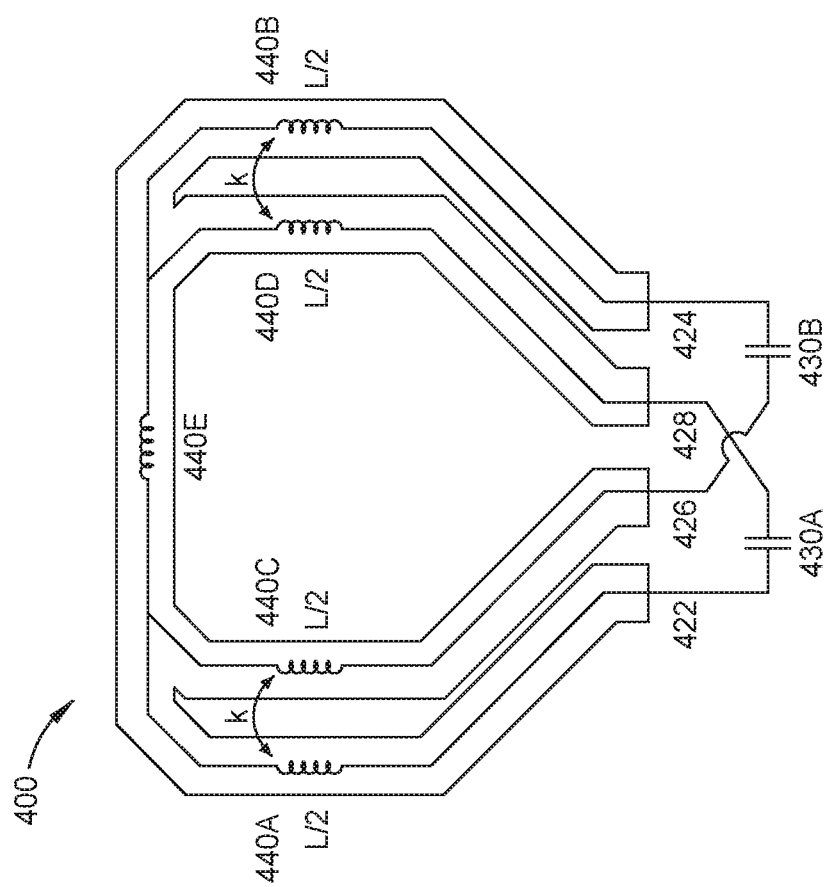
FIG. 4 illustrates a structure for an improved LC VCO tank, according to an embodiment.

In an embodiment, the inductors 340A-D each have an inductance of 12. That is, the inductance of each pair of inductors in each LC tank (e.g., 340A and 340D) is equal to L. In an embodiment, the inductor 340E has an inductance $L_H$. Each capacitor 330A-D has a capacitance of 2C. The pairs of inductors in each LC tank (e.g., 340A and 340D) are spaced such that they have a magnetic coupling coefficient k. In an embodiment, FIG. 3 illustrates a schematic for an example LC VCO architecture 300. FIGS. 4-5, below, illustrate further the structure of this LC VCO architecture.

The LC VCO architecture 300 provides several advantages over existing architectures. For example, the two LC tanks are identical and are strongly coupled. This can significantly reduce phase noise. In an embodiment, this reduced phase noise by a factor of 3 dB. Further, the LC VCO architecture 300 provides a dual resonance topology, which allows use of a single capacitor bank to resonate the tanks at a frequency f0 for differential-mode signals and a frequency 2f0 for common-mode signals. To facilitate this, the capacitors 330A-D can be implemented using a single capacitor bank. This is discussed further below in relation to FIGS. 4-5.

Another example advantage is that the topology is implemented using a CMOS structure (e.g., for the transistors 310, 312, 314, and 316). This allows current to be re-used, and reduces the power overhead. For example, two LC tanks typically consume double the amount of power. In the LC VCO architecture 300 illustrated in FIG. 3, with the CMOS architecture, the current is reused between the two LC-tanks, thereby saving 50% of the power consumption. Another example advantage is that the strong coupling between the LC tanks ensures oscillation at a single resonance frequency, without ambiguity. A final example advantage is that the dual resonance structure reduces flicker noise up-conversion to phase noise.

FIG. 4 illustrates a structure for an improved LC VCO architecture 400, according to an embodiment. In an embodiment, the illustrated LC VCO architecture 400 is an implementation of the schematic illustrated in FIG. 3. In an embodiment, the nodes 422, 424, 426, and 428 correspond with the nodes 322, 324, 326, and 328, respectively illustrated in FIG. 3. That is, in an embodiment the LC VCO architecture 400 illustrates an implementation of the architecture in which all four nodes 422, 424, 426, and 428 are on the same side. Further, transistors connected to the nodes (e.g., the transistors 310, 312, 314, and 316 illustrated in FIG. 3) are also located on the same side of the circuit as the nodes 422, 424, 426, and 428.

Further, in an embodiment, the inductors 440A-E correspond with the inductors 340A-E illustrated in FIG. 3. The inductor 440A is connected to the node 422, the inductor 440C is connected to the node 426, the inductor 440D is connected to the node 428, and the inductor 440B is connected to the node 424. In an embodiment, the inductors 440A-440E are made up of a shared inductor structure. That is, in an embodiment, a single inductor structure can realize all of the inductances of the inductors 440A-E.

In an embodiment, each of the inductors 440A, 440B, 440C, and 440D has an inductance of L/2. The inductor 440E has an inductance of $L_H$. The inductors 440A and 440C have a coupling coefficient k, and the inductors 440D and 440B have a coupling coefficient k. In an embodiment, the inductors 440A-E are fabricated using a single layer of metal (or another suitable conductive material).

In an embodiment, capacitors 430A and 430B correspond with the capacitors 330A-D illustrated in FIG. 3. Capacitors connected in series can be treated as a single capacitance. In one embodiment, the capacitors 330A and 330D, illustrated in FIG. 3, are connected in series, and correspond with the capacitor 430A illustrated in FIG. 4. The capacitors 330B and 330C, illustrated in FIG. 3, are also connected in series and correspond with the capacitor 430B illustrated in FIG. 4. In an embodiment, the capacitors 430A and 430B are connected to the nodes 422, 424, 426, and 428, and are not connected to ground. Alternatively, a same value of capacitance could be used for capacitors 430A and 430B.

In an embodiment, the LC VCO architecture 400 provides several additional advantages. For example, the nodes 422, 424, 426, and 428 are located on the same side. This can simplify routing. Further, as discussed above, transistors connected to the nodes 422, 424, 426, and 428 are also located on the same side. This avoids potential issues caused by mismatched transistors, because the transistors do not have to be split up across different sides. As another example, use of differentially connected capacitors (e.g., the capacitors 430A and 430B can be a differential connected variable capacitor), and avoiding connecting capacitors to ground, can provide significant improvements, especially for high frequency implementations.

Figure 5A:
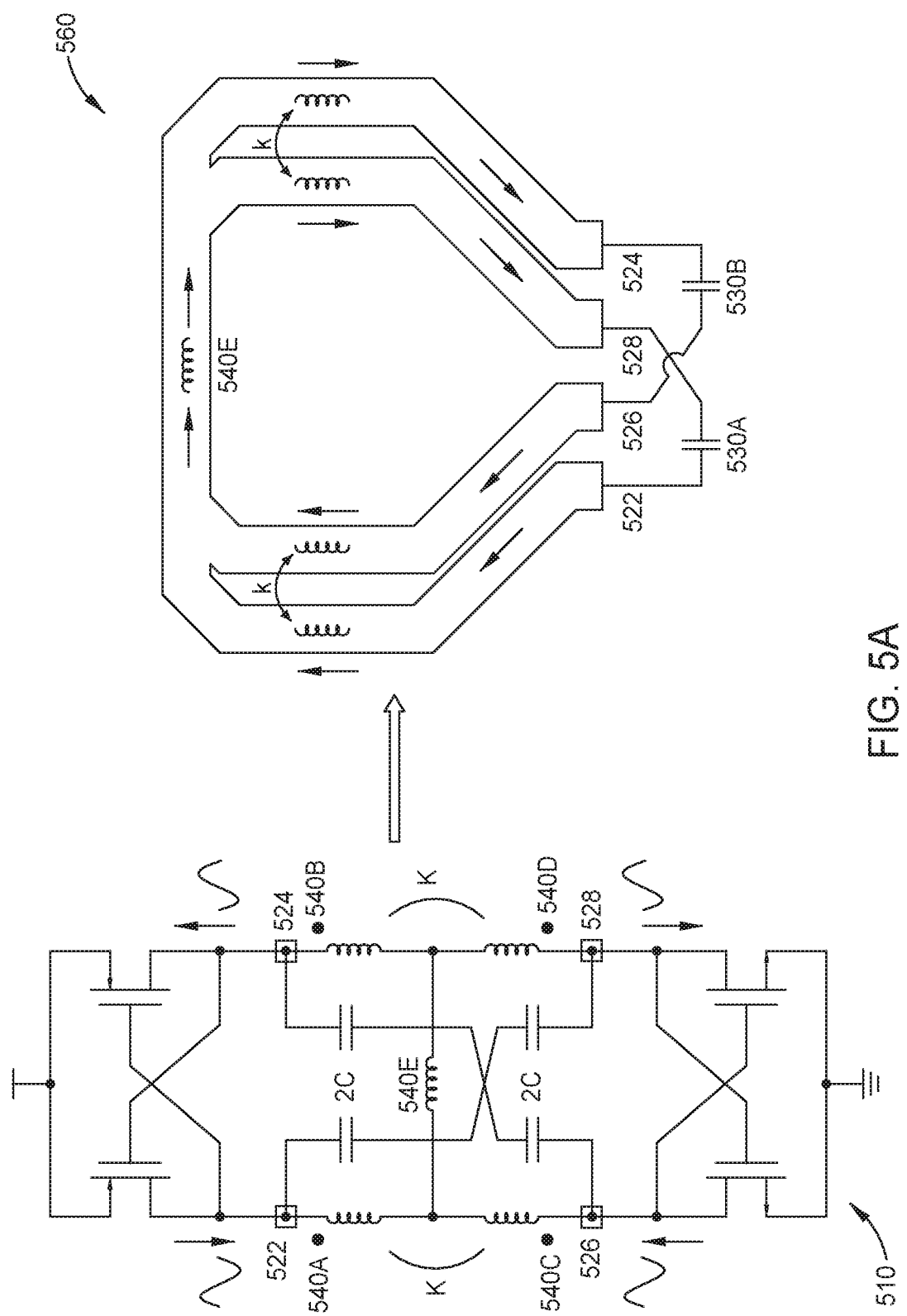
FIG. 5A illustrates fundamental-mode current flow in an improved LC VCO architecture, according to an embodiment.

FIG. 5A illustrates fundamental-mode current flow in an improved LC VCO architecture, according to an embodiment. In an embodiment, the illustration in FIG. 5A corresponds with the desired resonance at the frequency $f_0$ (i.e., odd harmonic current flow). A schematic 510 provides a schematic illustration of the LC VCO architecture. In an embodiment, the schematic 510 corresponds with the schematic illustrated in FIG. 3. A structure 560 provides an illustration of an example implementation of the LC VCO architecture (e.g., as illustrated in the schematic 510). In an embodiment, the structure 560 corresponds with the structure illustrated in FIG. 4.

For example, in an embodiment, the schematic 510 and the structure 560 each include four nodes 522, 524, 526, and 528. These four nodes correspond with the nodes 322, 324, 326, and 328 illustrated in FIG. 3, and the four nodes 422, 424, 426, and 428 illustrated in FIG. 4. The schematic 510 further includes inductors 540A-E. These inductors 540A-E correspond with the inductors 340A-E illustrated in FIG. 3 and the inductors 440A-E illustrated in FIG. 4. In an embodiment, the inductors 540A-D each have an inductance of 112. The inductor 540E has an inductance of $L_H$. The inductors 540A and 540C, and 540B and 540D, are respectively coupled with a coupling coefficient k. The structure 560 further includes capacitors 530A and 530B. These capacitors 530A and 530B correspond with the capacitors 430A and 430B illustrated in FIG. 4.

In an embodiment, the structure 560 illustrates current flow in the inductors for resonance at the fundamental frequency $f_0$. For example, current enters at the node 522 (e.g., from one or more transistors) and exits at the node 528. Similarly, current enters at the node 526 and exits at the node 524. In an embodiment, the inductance between nodes 522 and 528 is shown by the equation: $L_{(522 \to 528)} \approx L(1+k)+2L_H$. The inductance between nodes 526 and 524 is shown by the equation: $L_{(522 \to 528)} \approx L(1+k)+2L_H$.

Figure 5B:
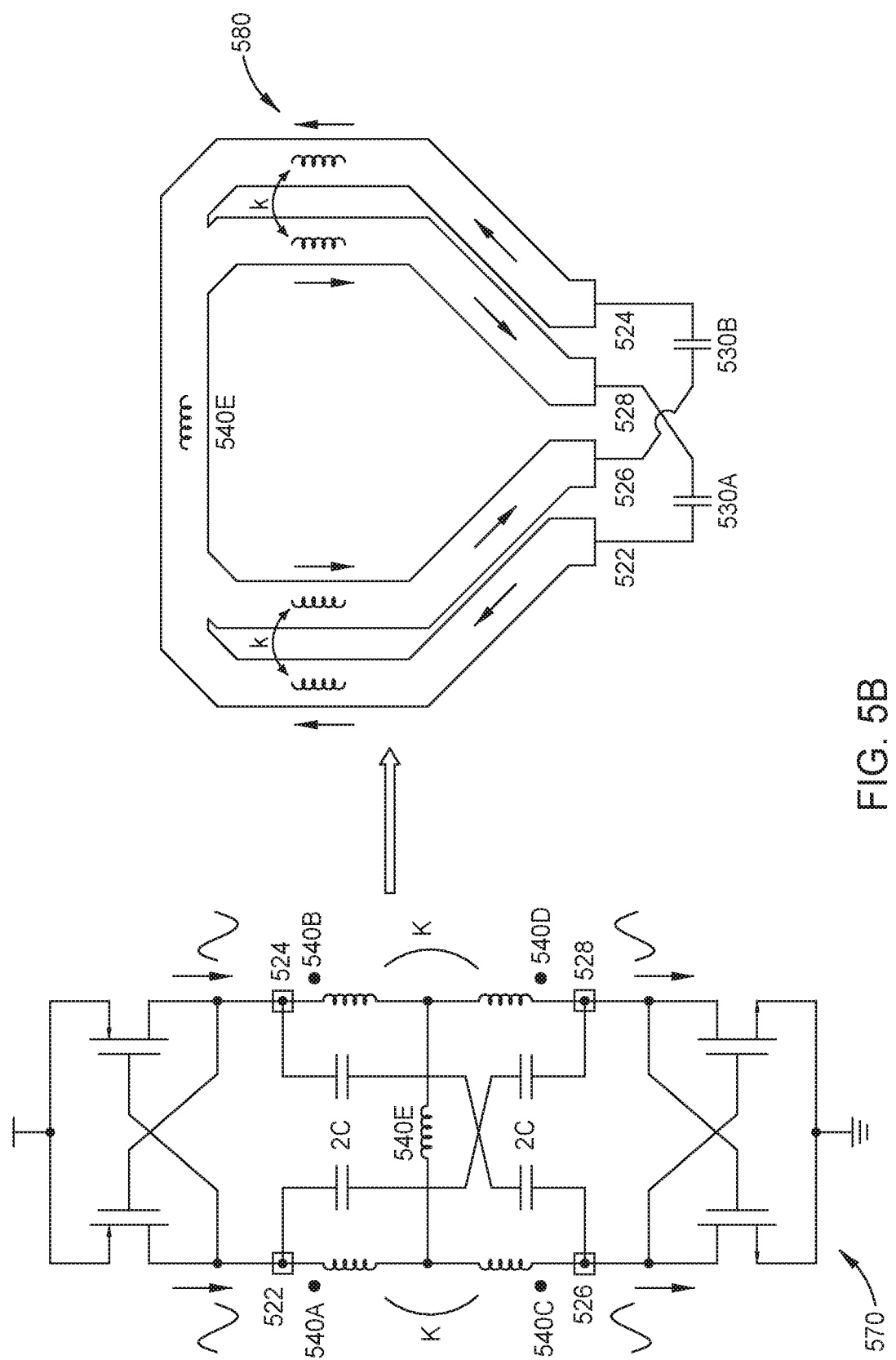
FIG. 5B illustrates common-mode current flow in an improved LC VCO architecture, according to an embodiment.

FIG. 5B illustrates common-mode current flow in an improved LC VCO architecture, according to an embodiment. In an embodiment, the illustration in FIG. 5B corresponds with resonance at the common mode (i.e., even harmonic flow). A schematic 570 provides a schematic illustration of the LC VCO architecture. In an embodiment, the schematic 570 corresponds with the schematic illustrated in FIG. 3. A structure 580 provides an illustration of an example implementation of the LC VCO architecture (e.g., as illustrated in the schematic 570). In an embodiment, the structure 580 corresponds with the structure illustrated in FIG. 4.

For example, in an embodiment, the schematic 570 and the structure 580 each include four nodes 522, 524, 526, and 528. These four nodes correspond with the nodes 322, 324, 326, and 328 illustrated in FIG. 3, and the four nodes 422, 424, 426, and 428 illustrated in FIG. 4. The schematic 570 further includes inductors 540A-E. These inductors 540A-E correspond with the inductors 340A-E illustrated in FIG. 3 and the inductors 440A-E illustrated in FIG. 4. In an embodiment, the inductors 540A-D each have an inductance of L/2. The inductor 540E has an inductance of $L_H$. The inductors 540A and 540C, and 540B and 540D, are respectively coupled with a coupling coefficient k. The structure 580 further includes capacitors 530A and 530B. These capacitors 530A and 530B correspond with the capacitors 430A and 430B illustrated in FIG. 4.

In an embodiment, the structure 580 illustrates current flow in the inductors for resonance at the common mode frequency $2f_0$. For example, current enters at the node 522 (e.g., from one or more transistors) and exits at the node 526. Similarly, current enters at the node 524 and exits at the node 528. In an embodiment, no current flows through the inductor 540E. In an embodiment, the inductance between nodes 522 and 528 is shown by the equation: $L_{(522 \to 528)} \approx L(1+k)$. The inductance between nodes 526 and 524 is shown by the equation: $L_{(522 \to 528)} \approx L(1+k)$. In an embodiment, the inductance is reduced because the current flows in adjacent arms are opposite to each other.

Further, the common-mode resonance is greater than the differential-mode (i.e., fundamental) resonance, which can be shown by the following equation, in which $\omega_{diff}$ represents the differential-mode resonance:

$$\omega_{diff} = \frac{1}{\sqrt{(L(1+k)+2L_H)C}}.$$

The common-mode resonance, $\omega_{CM}$, can be shown by the equation:

$$\omega_{CM} = \frac{1}{\sqrt{(L(1-k))C}}.$$

Following this equation, a structure can be designed so that the common mode resonance frequency is double the differential mode resonance frequency. Assume $L_H$ is equal to L/4, and k=0.5. Then $$\frac{L_{diff}}{LCM} = \frac{L(1+k)+2L_H}{L(1-k)} = 4,$$

and $$\frac{\omega_{CM}}{\omega_{diff}} = 2.$$

Thus, with the LC VCO architecture illustrated in FIGS. 3-5, the common mode resonance will be exactly at twice the differential-mode resonance, using the same inductor and capacitor banks.

FIG. 6A is a graph 600 illustrating a simulation of common-mode and differential-mode inductance in an improved LC VCO architecture, according to an embodiment. In an embodiment, the graph 600 illustrates common mode and differential mode inductance between pairs of nodes, for example between the nodes 522 and 528 illustrated in FIGS. 5A-B, or between the nodes 526 and 524 illustrated in FIGS. 5A-B.

Assume the simulation relates to an architecture where $L_H$ is equal to L/4, and k=0.5, as discussed above. An operating region for common mode inductance is in a frequency range of approximately 4-6×10$^{10}$ Hz. The inductance is approximately 55 pH. An operating region for differential mode inductance in a frequency range of approximately 2-3×10$^{10}$ Hz. The inductance is approximately 220 pH. This matches our expected value of differential-mode inductance being four times common-mode inductance:

$$\frac{L_{diff}}{LCM} = \frac{L(1+k)+2L_H}{L(1-k)} = 4.$$

Figure 6B:
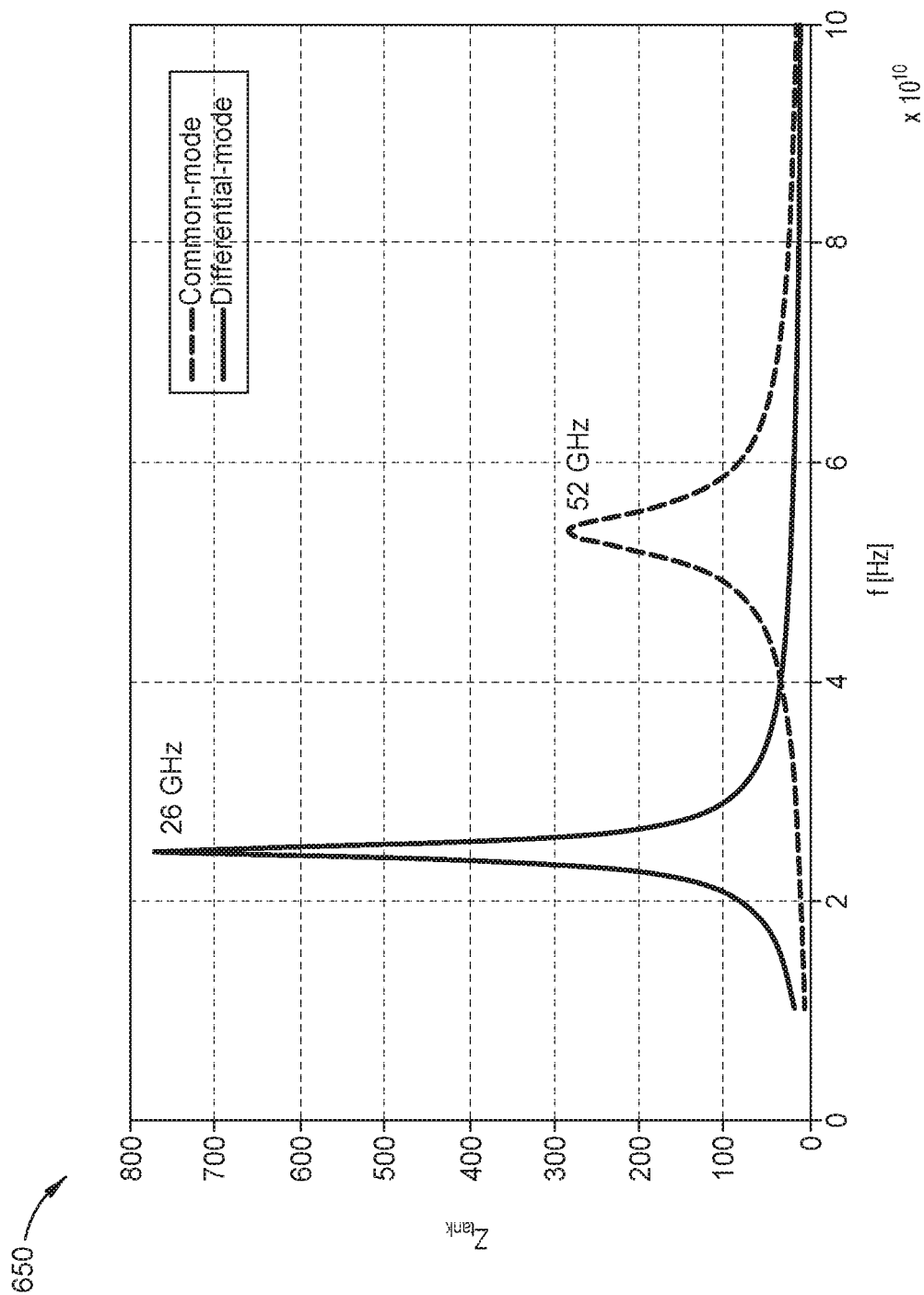
FIG. 6B is a graph illustrating a simulation of common-mode and differential-mode tank impedance in an improved LC VCO architecture, according to an embodiment.

FIG. 6B is a graph 650 illustrating a simulation of common-mode and differential-mode tank impedance in an improved LC VCO architecture, according to an embodiment. Assume the simulation relates to an architecture where $L_H$ is equal to L/4, and k=0.5, as discussed above. An operating region for common mode resonance is again in a frequency range of approximately 4-6×10$^{10}$ Hz. The resonance is approximately 52 GHz. An operating region for differential mode resonance is again in a frequency range of approximately 2-3×10$^{10}$ Hz. The resonance is approximately 26 GHz. This matches our expected value of differential-mode resonance being ½ common-mode resonance:

$$\frac{\omega_{CM}}{\omega_{diff}} = 2.$$

Figure 6C:
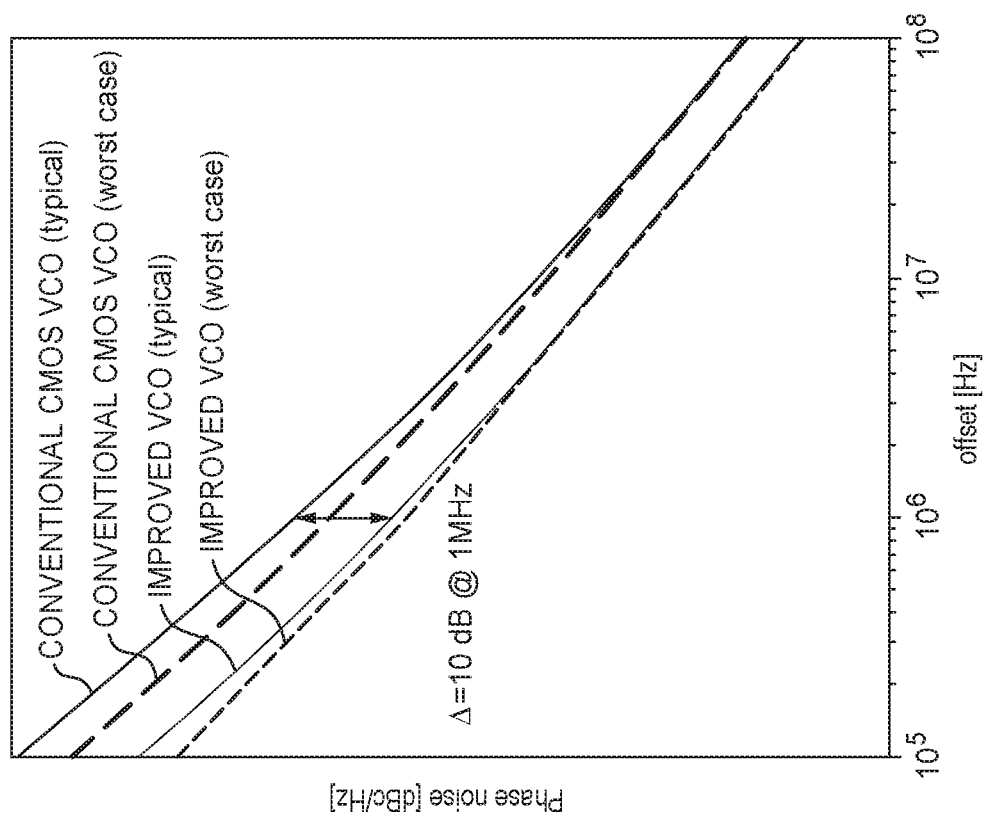
FIG. 6C is a graph illustrating phase noise, according to an embodiment.

FIG. 6C is a graph 690 illustrating phase noise, according to an embodiment. In an embodiment, one or more techniques described in connection with the LC VCO architecture illustrated in FIGS. 3-5 can result in significant phase noise improvements over a typical CMOS VCO. Given the same differential inductor and the same power consumption, implementing one or more of these techniques can provide a 10 dB improvement in phase noise. This can result in 10× power savings, assuming that every 3-dB of phase noise reduction typically comes at the expense of 2× power consumption.

In an embodiment, as illustrated in FIG. 6C, this improvement applies to both typical and worst-case scenarios. In an embodiment, the phase noise is improved in both a worst-case and a typical scenario, and there is less of a difference between worst-case and typical scenarios, as compared to a conventional LC VCO architecture (e.g., as discussed above in relation to FIG. 2C). In an embodiment, jitter is also significantly improved. For example, with a 10 dB reduction in phase noise, jitter can be reduced by a factor of approximately 3.

The graphs illustrated in FIGS. 6A-C are merely examples, and the illustrated parameters and values are not limiting. Any suitable parameters values can be used, as discussed above in relation to FIGS. 3-5.

Figure 7:
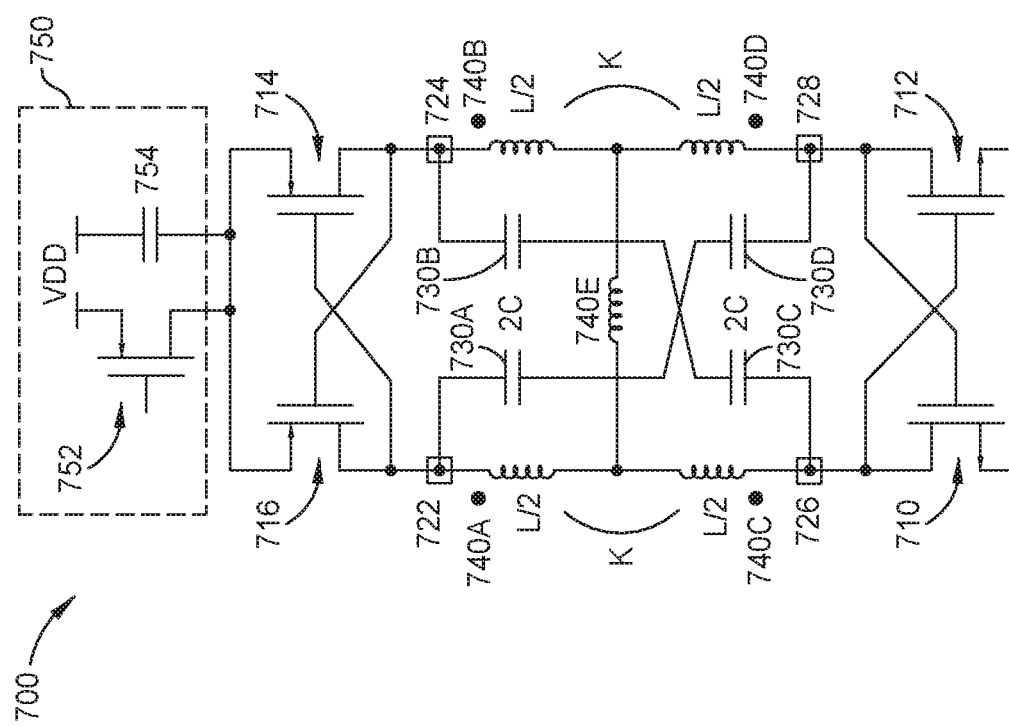
FIG. 7 illustrates a PMOS current source with an improved LC VCO architecture, according to an embodiment.

FIG. 7 illustrates a PMOS current source 750 with an improved LC VCO architecture 700, according to an embodiment. In an embodiment, the VCO architecture 700 largely corresponds with the schematic illustrated in FIG. 3. For example, the transistors 710, 712, 714, and 716 correspond with the transistors 310, 312, 314, and 316 illustrated in FIG. 3. The nodes 722, 724, 726, and 728 correspond with the nodes 322, 324, 326, and 328 illustrated in FIG. 3. The inductors 740A-E correspond with the inductors 340A-E illustrated in FIG. 3. The capacitors 730A-D correspond with the capacitors 330A-D illustrated in FIG. 3.

The VCO architecture 700 includes a current source 750. The current source 750 includes a voltage source Vdd, a PMOS transistor 752, and a bypass capacitor 754. In an embodiment, using a current source to bias the VCO has the benefit of maintaining a constant DC current through the VCO across process, voltage and temperature, thereby regulating its current consumption. Further, in an embodiment the current source 750 acts as a current source for the VCO architecture 700. Further, in an embodiment, the bypass capacitor 754 filters bias noise and provides a low impedance path for common mode currents.

Figure 8:
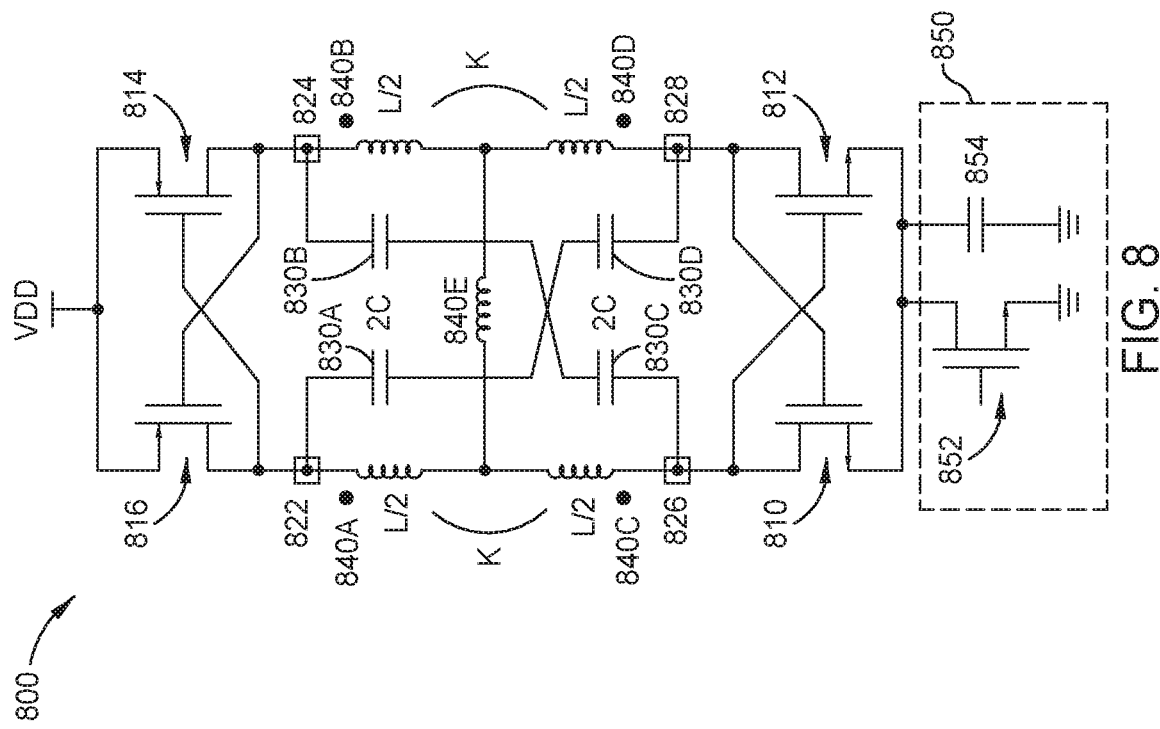
FIG. 8 illustrates an NMOS current source with an improved LC VCO architecture, according to an embodiment.

FIG. 8 illustrates an NMOS current source 850 with an improved LC VCO architecture 800, according to an embodiment. In an embodiment, the VCO architecture 800 largely corresponds with the schematic illustrated in FIG. 3. For example, the transistors 810, 812, 814, and 816 correspond with the transistors 310, 312, 314, and 316 illustrated in FIG. 3. The nodes 822, 824, 826, and 828 correspond with the nodes 322, 324, 326, and 328 illustrated in FIG. 3. The inductors 840A-E correspond with the inductors 340A-E illustrated in FIG. 3. The capacitors 830A-D correspond with the capacitors 330A-D illustrated in FIG. 3.

The VCO architecture 800 includes a current source 850. The current source 850 includes a PMOS transistor 852 and a bypass capacitor 854. In an embodiment, the current source 850 acts as a current source for the VCO architecture 800. Further, in an embodiment, the bypass capacitor 854 filters bias noise and provides a low impedance path for common mode currents.

In the current disclosure, reference is made to various embodiments. However, the scope of the present disclosure is not limited to specific described embodiments. Instead, any combination of the described features and elements, whether related to different embodiments or not, is contemplated to implement and practice contemplated embodiments. Additionally, when elements of the embodiments are described in the form of "at least one of A and B," it will be understood that embodiments including element A exclusively, including element B exclusively, and including element A and B are each contemplated. Furthermore, although some embodiments disclosed herein may achieve advantages over other possible solutions or over the prior art, whether or not a particular advantage is achieved by a given embodiment is not limiting of the scope of the present disclosure. Thus, the aspects, features, embodiments and advantages disclosed herein are merely illustrative and are not considered elements or limitations of the appended claims except where explicitly recited in a claim(s). Likewise, reference to "the invention" shall not be construed as a generalization of any inventive subject matter disclosed herein and shall not be considered to be an element or limitation of the appended claims except where explicitly recited in a claim(s).

The and block diagrams in the Figures illustrate the architecture, functionality, and operation of possible implementations of systems, according to various embodiments. In this regard, each block in the block diagrams may represent a module or segment relating to specified logical function(s). It should also be noted that, in some alternative implementations, the functions noted in the block may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams, and combinations of blocks in the block diagrams, can be implemented by special purpose hardware-based systems that perform the specified functions or acts, or combinations of special purpose hardware and computer instructions.

In view of the foregoing, the scope of the present disclosure is determined by the claims that follow.

We claim:
1. A voltage controlled oscillator (VCO), comprising:
a plurality of nodes coupled with a plurality of transistors,
wherein the plurality of nodes comprises a first node, a second node, a third node, and a fourth node, each of which is connected to a respective transistor of the plurality of transistors; and
a first inductor-capacitor (LC) tank coupled with a second LC tank,
wherein the first LC tank and the second LC tank comprise a shared inductor structure coupled to the plurality of nodes,
wherein the shared inductor structure comprises a first inductor coupled with the first node, a second inductor coupled with the second node, a third inductor coupled with the third node, a fourth inductor coupled with the fourth node, and a fifth inductor coupled with the first, second, third, and fourth inductors,
wherein the first LC tank and the second LC tank each comprise a capacitor, and wherein the capacitors are each coupled on a first side to a node of the plurality of nodes and on a second side to a respective capacitor in the other LC tank, wherein the first LC tank and the second LC tank are configured to resonate at a fundamental frequency for differential-mode signals, and wherein the first LC tank and the second LC tank are configured to resonate at twice the fundamental frequency for common-mode signals.

2. The VCO of claim 1, wherein the plurality of transistors comprises a first NMOS transistor coupled with the first node, a second NMOS transistor coupled with the second node, a first PMOS transistor coupled with the third node, and a second PMOS transistor coupled with the fourth node.

3. The VCO of claim 1, wherein the first inductor, the second inductor, the third inductor, and the fourth inductor all comprise a same inductance value.

4. The VCO of claim 3, wherein the fifth inductor comprises a different inductance value from the first inductor, the second inductor, the third inductor, and the fourth inductor.

5. The VCO of claim 1, wherein the first inductor and the second inductor are spaced to have a first coupling coefficient, and the third inductor and the fourth inductor are spaced to have a same coupling coefficient.

6. The VCO of claim 1, wherein none of the capacitors is connected directly to ground.

7. The VCO of claim 1, wherein at least one of the capacitors comprises a variable capacitor.

8. The VCO of claim 1, comprising at least one of: (i) a PMOS current source coupled with one or more of the plurality of transistors, the PMOS current source comprising a PMOS transistor, a capacitor, and a voltage source or (ii) an NMOS current source coupled with one or more of the plurality of transistors, the NMOS current source comprising an NMOS transistor and a capacitor.

9. A voltage controlled oscillator (VCO), comprising:
a plurality of nodes coupled with a plurality of transistors; and
a first inductor-capacitor (LC) tank directly coupled with a second LC tank,
wherein the first LC tank and the second LC tank comprise a shared inductor structure coupled to the plurality of nodes,
wherein the plurality of nodes comprises a first node, a second node, a third node, and a fourth node, each of which is connected to a respective transistor of the plurality of transistors, and wherein the shared inductor structure comprises a first inductor coupled with the first node, a second inductor coupled with the second node, a third inductor coupled with the third node, a fourth inductor coupled with the fourth node, and a fifth inductor coupled with the first, second, third, and fourth inductors, wherein the first LC tank and the second LC tank are configured to resonate at a fundamental frequency for differential-mode signals, and wherein the first LC tank and the second LC tank are configured to resonate at twice the fundamental frequency for common-mode signals.

10. The VCO of claim 9, wherein the first LC tank and the second LC tank each comprise a capacitor, and wherein the capacitors are each coupled on a first side to a node of the plurality of nodes and on a second side to a respective capacitor in the other LC tank.

11. The VCO of claim 10, wherein none of the capacitors is coupled directly to ground.

12. The VCO of claim 9, wherein the first inductor, the second inductor, the third inductor, and the fourth inductor all comprise a same inductance, and wherein the fifth inductor comprises a different inductance value from the first inductor, the second inductor, the third inductor, and the fourth inductor.

13. A voltage controlled oscillator (VCO), comprising:
a first inductor-capacitor (LC) tank comprising a first pair of inductors;
a second LC tank comprising second pair of inductors,
wherein the first pair of inductors are each directly coupled to at least one of the second pair of inductors through a third inductor,
wherein the first LC tank and the second LC tank are configured to resonate at a fundamental frequency for differential-mode signals, and
wherein the first LC tank and the second LC tank are configured to resonate at twice the fundamental frequency for common-mode signals; and at least one of:
(i) a PMOS current source for the first and second LC tanks, the PMOS current source comprising a PMOS transistor, a capacitor, and a voltage source, and
(ii) an NMOS current source for the first and second LC tanks, the NMOS current source comprising an NMOS transistor and a capacitor.

14. The VCO of claim 13, wherein the first LC tank and the second LC tank each comprise a capacitor, and wherein the capacitors are each coupled on a first side to a node of a plurality of nodes and on a second side to a respective capacitor in the other LC tank.

15. The VCO of claim 14, wherein none of the capacitors is coupled directly to ground.

* * * * *

UNITED STATES PATENT AND TRADEMARK OFFICE
CERTIFICATE OF CORRECTION

PATENT NO. : 11,218,113 B1
APPLICATION NO. : 17/031462
DATED : January 4, 2022
INVENTOR(S) : Abhishek Bhat et al.

It is certified that error appears in the above-identified patent and that said Letters Patent is hereby corrected as shown below:

In the Specification

In Column 5, Line 28, delete "12." and insert -- $L/2$. --.

In Column 7, Line 3, delete "112." and insert -- $L/2$. --.

In Column 7, Line 17, delete "$L_{(522 \to 528)}$" and insert -- $L_{(526 \to 524)}$ --.

In Column 7, Line 53, delete "(1+k)." and insert -- (1-k). --.

In Column 7, Line 55, delete "$L_{(522 \to 528)} \approx L(1+k)$." and insert -- $L_{(526 \to 524)} \approx L(1-k)$. --.

Signed and Sealed this
Third Day of May, 2022

Katherine Kelly Vidal
*Director of the United States Patent and Trademark Office*